(12) United States Patent
Maltsev et al.

(10) Patent No.: US 6,998,941 B2
(45) Date of Patent: Feb. 14, 2006

(54) FREQUENCY MULTIPLIER

(76) Inventors: Sergey Borisovich Maltsev, Malopodvalnaya ul., d.28/9, vk.50, 01304, Kiev (UA); Daniil Olegovich Korneev, 6-aya Sovetskaya ul., d.31, kv. 6, 193036, St. Petersburg (RU)

(*) Notice: Subject to any disclaimer, the term of this patent is extended or adjusted under 35 U.S.C. 154(b) by 0 days.

(21) Appl. No.: 10/473,280

(22) PCT Filed: Mar. 26, 2002

(86) PCT No.: PCT/RU02/00137

§ 371 (c)(1),
(2), (4) Date: Sep. 30, 2003

(87) PCT Pub. No.: WO02/091563

PCT Pub. Date: Nov. 14, 2002

(65) Prior Publication Data

US 2005/0099248 A1     May 12, 2005

(30) Foreign Application Priority Data

May 10, 2001     (RU)     .................... 2001112971

(51) Int. Cl.
*H03B 19/00*     (2006.01)
(52) U.S. Cl. ............... 333/218; 333/250; 327/116; 327/123
(58) Field of Classification Search ........... 333/218, 333/250; 327/123, 119, 116
See application file for complete search history.

(56) References Cited

U.S. PATENT DOCUMENTS 4,636,758 A * 1/1987 Mettoudi ............... 333/218

* cited by examiner

*Primary Examiner*—Stephen E. Jones
(74) *Attorney, Agent, or Firm*—John D. Gugliotta

(57) ABSTRACT

The invention can be used for telecommunications, measuring and other devices in order to produce stable superhigh frequency signals. An IMPATT diode (4) operating in the cascade break-down mode and having a sharp nonlinearity transforms an input signal in such a way that ultraharmonics which multiple in respect to the frequency of an input signal $\omega_0$ occur in a frequency spectrum. An output stage of a multiplier is used in order to separate an output $n\omega_0$ frequency and to suppress adjacent frequencies. In order to tune the output stage to the $n\omega_0$ frequency, a tuning plug (8) and short-circuiting pistons (13) are used. The tuning plug (8) is arranged above an upper electrod of the IMPATT diode (4) (inside the axis of the diode). The tuning plugs (13) make it possible to tune resonance capacitance to the $n\omega_0$ frequency and remove energy towards the output part of a T-bend in which a wave guide pass-band filter (15) is disposed. Said filter (15) is embodied in the form of sections of a waveguide (14) on whose E-plane a thin metallic diaphragm is arranged, said diaphragm being provided with windows (16) disposed along the axis of the waveguide. The inventive multiplier ensures high converting efficiency.

5 Claims, 1 Drawing Sheet

FREQUENCY MULTIPLIER

Figure 1:
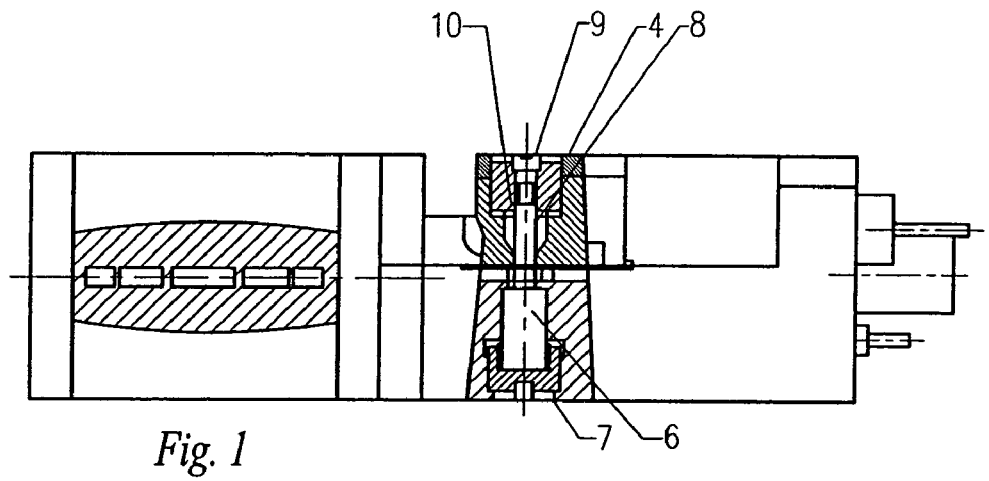

The invention refers to electronics and can be used for telecommunications, measuring and other devices in order to produce stable superhigh frequency signals.

PREVIOUS TECHNICAL LEVEL

In order to solve a number of problems occurring in telecommunications and measuring, high-frequency sources, stable in amplitude, frequency and phase, with a power ranging in decades of milliwatts are required to be used. Known sources which use the principle of frequency multiplication due to nonlinearity between the voltage applied to a diode and the current flowing through it, make it possible to produce an output signal with a multiplication ratio not exceeding 10 and output frequency not exceeding 40 GHz.

Known is a frequency multiplier containing an inlet filter to whose outlet a multiplier diode is connected, then comes a coupling element with the first end connected to the multiplier diode and the second end arranged in the output filter fitted in a section of an evanescent waveguide with conducting open-circuit rods fixed on a wide wall inside the waveguide in a way providing for trimming possibility, one of the said conducting open-circuit rods that is nearest to the multiplier diode has an axial reach-through hole, and the coupling element is embodied in the form of an L-shaped conductor and is installed in such a way that its second end is placed inside the axial hole out of contact with its inner walls (1133K, 1681376).

Known is a frequency multiplier containing a pulse former, a time-to-code converter, a code-to-time converter and a clock-pulse generator, whose output is connected to the clock inputs of the time-to-code converter and code-to-time converter, the first and second outputs of the pulse former are connected respectively to the clear input and storage input of the time-to-code converter, the low-order signal output and high-order signal output are connected respectively to the low-order signal input and high-order signal input of the code-to-time converter, the pulse former input is the frequency multiplier input, and the code-to-time converter is the output of the frequency multiplier, the latter having a code-former connected in series with a digital/analog converter which has its output connected to the clock-pulse generator driving input, the code-former clear input is connected to the first input of the pulse-former, and the data-signal input of the of the code-former is connected to the low-order signal output of the time-to-code converter (USSR, 1695487).

Known is a frequency multiplier including an input circuit embodied as a coaxial connector for the input of signal to be multiplied, a means of supplying the signal to be multiplied to the IMPATT diode mounted in a retainer, a means of supplying dc bias voltage to the diode, and an output waveguide frame (U.S. Pat. No. 4,636,758).

Known devices have insufficient conversion efficiency and frequency multiplication ratio.

DISCLOSURE OF INVENTION

This invention is based on a solution of the problem of creating a frequency multiplier with a multiplication ratio ranging from 3 to 30 on a frequency ranging from 20 to 180 GHz, to ensure an output power up to 20 mW, at a limiting multiplication ratio.

The problem in view is solved owing to the fact that the frequency multiplier including an input circuit embodied as a coaxial connector for the input of a signal to be multiplied, a means of supplying the signal to be multiplied to the IMPATT diode mounted in a retainer, a means of supplying dc bias voltage to the diode, and an output waveguide frame, is characterized by the fact that the means of the input of a signal to be multiplied is embodied as a microstrip line formed on polycore wafer, and a gold-plated strip connected by welding to the microstrip line and to the diode, the means of supplying dc bias voltage to the diode is embodied as a quarter-wave filter formed by the microstrip inductance and capacitance, at that the output waveguide circuit is embodied as a waveguide T-bend with an IMPATT diode arranged in the centre and two short-circuiting pistons fitted in two opposite arms, the third arm allocating a waveguide passband filter.

The inventive solution has a number of additional features describing its special cases, specific forms of its physical embodiment, namely:

multiplier can be provided with a clamp to adjust the diode position in the retainer using an a adjusting screw, multiplier can be provided with a tuning plug to be fixed in a position in respect to the diode by means of a split terminal consisting of a collet and a screw, and to be positioned over the diode by means of a screw, multiplier can be provided with clamps to fix in a position the two short-circuiting pistons located at the two opposite ends of the T-bend, the waveguide pass-band filter is embodied as two equal waveguide sections with a metal diaphragm nipped between them, and also provided with windows disposed along the axis of the waveguide which is formed by the said sections.

The applicant has not detected any sources containing information on engineering solutions identical to the present invention which allows to draw a conclusion on its compliance with the novelty criterion (N).

High multiplication ratio in the range of superhigh frequencies is attained in the suggested engineering solution due to the inventive design features and an effective input frequency matching of the device components.

The applicant is not aware of any publications containing information on the effect of the inventive features on the technical result achieved. Therefore, it may be concluded, in the applicant's opinion, that this engineering solution complies with the inventive step criterion (IS).

ABSTRACT OF DRAWING FIGURES

The essence of the invention is illustrated by the drawing, where

Figure 2:
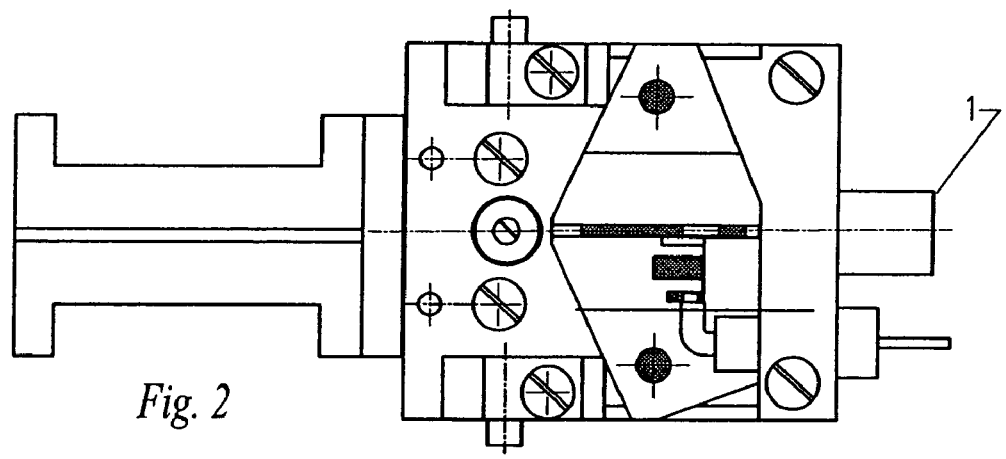
Figure 3:
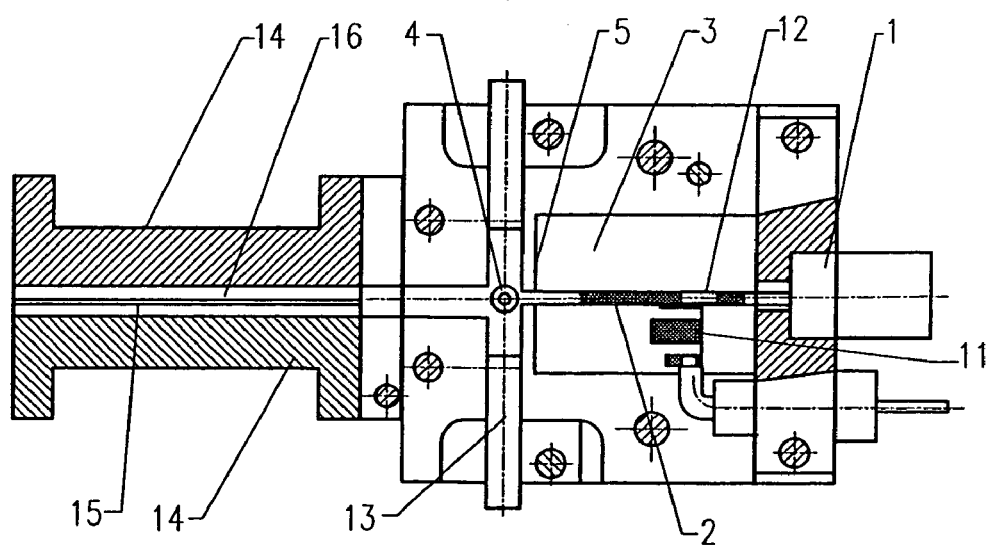

FIG. 1 shows the section of the device in the plane of the IMPATT diode center line, FIG. 2 shows the section of the device in the plane perpendicular to the IMPATT diode center line with fragments of the, FIG. 3 shows the same with the removed top closure head.

BEST OPTION OF THE INVENTION EMBODIMENT

The frequency multiplier includes a coaxial connector 1 to input a signal to be multiplied, a microstrip line 2 formed on the polycore wafer 3, which makes it possible to adjust the diode 4 to optimum matching of input frequency $\omega_0$ by setting additional loopbacks (chips) on the polycore microstrip board, a gold-plated strip 5 connected by welding to the upper electrode of the diode 4. The position of the diode 4 located in the retainer 6 is regulated by means of the screw 7. The means of the output circuit adjusting for frequency $\omega_0$ is embodied as a tuning plug 8 mounted in a way to allow its relocating in respect to the IMPATT diode 4 by means of the screw 9 and arresting in respect to the diode by means of the split terminal 10. The means of supplying the IMPATT diode 4 with dc bias voltage is embodied as a quarter-wave filter formed by the microstrip inductance 11 and capacitance 12 inserted in the slit of the microstrip line 2. The means of adjusting the output circuit to frequency $\omega_0$ also includes two sliding short-circuiting pistons 13 which are fitted in the two opposite arms of the T-bend and are provided with clamps to fix them in a position. The third arm of the T-bend accommodates the waveguide pass-band filter which is embodied as two sections of the waveguide 14 with a metal diaphragm 15 nipped between them and provided with windows 16 disposed along the axis of the waveguide.

The device works as follows.

The frequency multiplication by means of IMPATT diodes is based on a strong nonlinear dependence between the voltage applied to the diode and the current flowing through it at avalanching.

Three circuits can be found in the frequency multiplier:
1) input frequency circuit ($\omega_0$ frequency to be multiplied),
2) output frequency circuit ($n\omega_0$ frequency, where n is multiplication ratio),
3) fixed bias circuit.

The input and output circuits are coupled among themselves via IMPATT diode nonlinearity in the cascade break-down mode.

The input signal ranging from 2 to 15 GHz is fed through a SMA coaxial connector 1 which is soldered in the multiplier case. The input signal comes to the IMPATT diode 4 through the microstrip line 2 connected to the upper electrode of the diode 4 by means of the strip 5, which ensures a reliable contact and thermal stability of the multiplier operation due to fastening method (welding) and thermostable material with a high conductance, such as gold, used for the strip manufacturing. The microstrip line 2 is also used to supply the diode 4 with the fixed bias voltage which comes through a bushing insulator in the multiplier case. The cd bias voltage and ac input signal are decoupled by using a quarter-wave filter formed by the microstrip inductance 11 and capacitance 12 which is fitted in a breaking of the microstrip line 2 on the polycore board 3. The IMPATT diode 4 in the retainer 6 is placed at the centre of the T-bend which is formed in the multiplier case. The upper electrode of the diode 4 is on a level with the upper surface of the microstrip board 3. The appropriate position is fixed with the screw 7.

The IMPATT diode 4 operating in cascade break-down mode and having a sharp nonlinearity transforms an input signal in such a way that ultraharmonics which multiple in respect to the input signal frequency $\omega_0$ occur in the frequency spectrum. An output stage of a multiplier is used in order to separate an output $n\omega_0$ frequency and to suppress adjacent frequencies. In order to tune the output stage to the $n\omega_0$ frequency, a tuning plug 8 and short-circuiting pistons 13 are used. The tuning plug 8 is arranged above an upper electrode of the IMPATT diode 4 (inside the axis of the diode). The tuning plug position above the diode is regulated with the screw 9 and fixed with the collet 10. The tuning plugs 13 make it possible to tune resonance capacitance to the $n\omega_0$ frequency and remove energy towards the output part of a T-bend in which a wave guide pass-band filter 15 is disposed. Said filter 15 is embodied in the form of sections of a waveguide 14, on whose E-plane a thin metal diaphragm is arranged, said diaphragm being provided with windows 16 disposed along the axis of the waveguide.

The inventive multiplier design using n*-n-p* diode in cascade break-down mode as a nonlinear element ensures high converting efficiency, which makes approximately 1/n. So, at a frequency of 35 GHz, a typical output power value makes 100 mW, at an input power of 500 mW and multiplication ratio equal to 5. On a frequency of 94 GHz, an output power value attains 50 mW at an input power of 800 mW and multiplication ratio equal to 15. On a frequency of 140 GHz an output power value of 40 mW has been achieved at an input power of 900 mW and multiplication ratio equal to 20.

INDUSTRIAL APPLICABILITY

The inventive engineering solution can be realized by an industrial method with use of known materials (microstrip line, polycore wafer) and known technologies and hardware components (IMPATT diodes, clamps, tuning elements, waveguides), which, in the applicant's opinion, ensures its compliance with the industrial applicability criterion.

The use of the inventive engineering solution, as compared with all known means of similar designation, provides an output signal frequency ranging from 20 GHz to 180 GHz at an output power of several tens of milliwatts and a high ratio of input signal multiplication (ranging from 3 to 30).

What is claimed is:

1. A frequency multiplier including an input circuit, embodied as a coaxial connector to input a signal to be multiplied, a means of supplying a signal to be multiplied to IMPATT diode mounted in a retainer, a means of supplying the diode with dc bias voltage and output waveguide frame, distinguished by the fact that the means of inputting a signal to be multiplied is embodied as a microstrip line formed on a polycore wafer and connected to a gold-plated strip which is connected by welding to the diode, the means of supplying the diode with dc bias voltage embodied as a quarter-wave filter formed by the microstrip inductance and capacitance, the output waveguide circuit is embodied as a waveguide T-bend with an IMPATT diode arranged at the centre, two short-circuiting pistons fitted in two opposite arms and a pass-band filter disposed in the third arm.

2. The frequency multiplier of claim 1, distinguished by the fact that it is provided with a clamp which enables adjusting the diode's position in the retainer by means of a screw.

3. The frequency multiplier of claim 1, distinguished by the fact that it is provided with a tuning plug which is fixed in respect to the diode by means of a split terminal consisting of a collet and a screw, the position of the tuning plug above the diode is regulated with the screw.

4. The frequency multiplier of claim 1, 2, or 3, distinguished by the fact that it is provided with clamps to fix the position of two short-circuiting pistons fitted at two opposite ends of the T-bend.

5. The frequency multiplier of claim 1, 2, or 3, distinguished by the fact that the waveguide pass-band filter is embodied as two equal waveguide's sections with a metal diaphragm nipped between them, and also is provided with windows disposed along the axis of the waveguide which is formed by the said sections.

* * * * *